United States Patent
Diaz et al.

(10) Patent No.: US 10,453,522 B2
(45) Date of Patent: Oct. 22, 2019

(54) SRAM WITH STACKED BIT CELLS

(71) Applicant: Taiwan Semiconductor Manufacturing Co., Ltd., Hsinchu (TW)

(72) Inventors: Carlos H. Diaz, Mountain View, CA (US); Chih-Hao Wang, Baoshan Township (TW); Jean-Pierre Colinge, Hsinchu (TW); Ta-Pen Guo, Taipei (TW)

(73) Assignee: Taiwan Semicoductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/487,526

(22) Filed: Apr. 14, 2017

(65) Prior Publication Data

US 2017/0221555 A1    Aug. 3, 2017

Related U.S. Application Data

(63) Continuation of application No. 14/918,068, filed on Oct. 20, 2015, now Pat. No. 9,659,632.

(51) Int. Cl.

| G11C 11/21 | (2006.01) |
|---|---|
| G11C 11/419 | (2006.01) |
| G11C 11/412 | (2006.01) |
| H01L 27/11582 | (2017.01) |
| H01L 49/02 | (2006.01) |

(52) U.S. Cl.
CPC .......... *G11C 11/419* (2013.01); *G11C 11/412* (2013.01); *H01L 27/11582* (2013.01); *H01L 28/00* (2013.01)

(58) Field of Classification Search
CPC ............................ G11C 11/419; G11C 11/412
See application file for complete search history.

(56) References Cited

U.S. PATENT DOCUMENTS

| 5,517,038 | A | 5/1996 | Maeda et al. |
|---|---|---|---|
| 7,098,478 | B2 | 8/2006 | Takaura et al. |
| 7,214,963 | B2 | 5/2007 | Choi et al. |
| 7,924,604 | B2 | 4/2011 | Yang et al. |
| 9,659,632 | B2 | 5/2017 | Guo et al. |
| 2005/0179061 | A1 | 8/2005 | Jang et al. |

(Continued)

OTHER PUBLICATIONS

Taiwan Office Action dated May 12, 2017, Application No. 10620507880 (6 pages).

*Primary Examiner* — Douglas King
(74) *Attorney, Agent, or Firm* — Sterne, Kessler, Goldstein & Fox P.L.L.C.

(57) ABSTRACT

Static random access memories (SRAM) are provided. The SRAM includes a plurality of bit cells. Each bit cell includes a first inverter, a second inverter cross-coupled with the first inverter, a first pass gate transistor coupled between the first inverter and a bit line, and a second pass gate transistor coupled between the second inverter and a complementary bit line. The bit cells are divided into a plurality of top tier cells and a plurality of bottom tier cells, and each of the bottom tier cells is disposed under the individual top tier cell. The first inverter of the top tier cell is disposed on the second inverter of the corresponding bottom tier cell within a substrate, and the second inverter of the top tier cell is disposed on the first inverter of the corresponding bottom tier cell within the substrate.

20 Claims, 17 Drawing Sheets

(56) References Cited

U.S. PATENT DOCUMENTS

| | | | |
|---|---|---|---|
| 2009/0026524 A1* | 1/2009 | Kreupl | H01L 21/8221 |
| | | | 257/316 |
| 2010/0289084 A1* | 11/2010 | Yoon | H01L 27/228 |
| | | | 257/368 |
| 2015/0055402 A1* | 2/2015 | Chen | G11C 7/12 |
| | | | 365/156 |
| 2015/0085567 A1 | 3/2015 | Wang et al. | |
| 2015/0130068 A1 | 5/2015 | Lin et al. | |
| 2015/0206555 A1 | 7/2015 | Yang et al. | |

\* cited by examiner

|  | Col1 | Col2 | Col3 | Col4 |
|---|---|---|---|---|
| Row1 | MT2 |  |  | MT2 |
| Row2 | MU1 | MU2 | MU2 | MU1 |
| Row3 | MD1 | MD2 | MD2 | MD1 |
| Row4 |  | MT1 | MT1 |  |

Col1–Col2: BC1; Col3–Col4: BC2

FIG. 3B

SRAM WITH STACKED BIT CELLS

BACKGROUND

Static random access memories (SRAM) are commonly used in integrated circuits. Furthermore, SRAM are used for electronic applications where high speed, low power consumption and simple operations are needed. Embedded SRAM is particularly popular in high speed communication, image processing and system on chip (SOC) applications. SRAM has the advantageous feature of holding data without requiring a refresh.

SRAM includes a plurality of bit cells disposed in rows and columns to form an array. Each bit cell includes a plurality of transistors coupled to bit lines and word lines that are used to read and write a bit of data to the memory cell. Single-port SRAMs enable a single bit of data to be written to or read from a bit cell at a particular time. In contrast, a dual-port SRAMs enables multiple reads or writes to occur at approximately the same time.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 3B shows a simplified diagram illustrating configurations of six transistors in the two neighboring bit cells of FIG. 3A.

DETAILED DESCRIPTION

Figure 1:
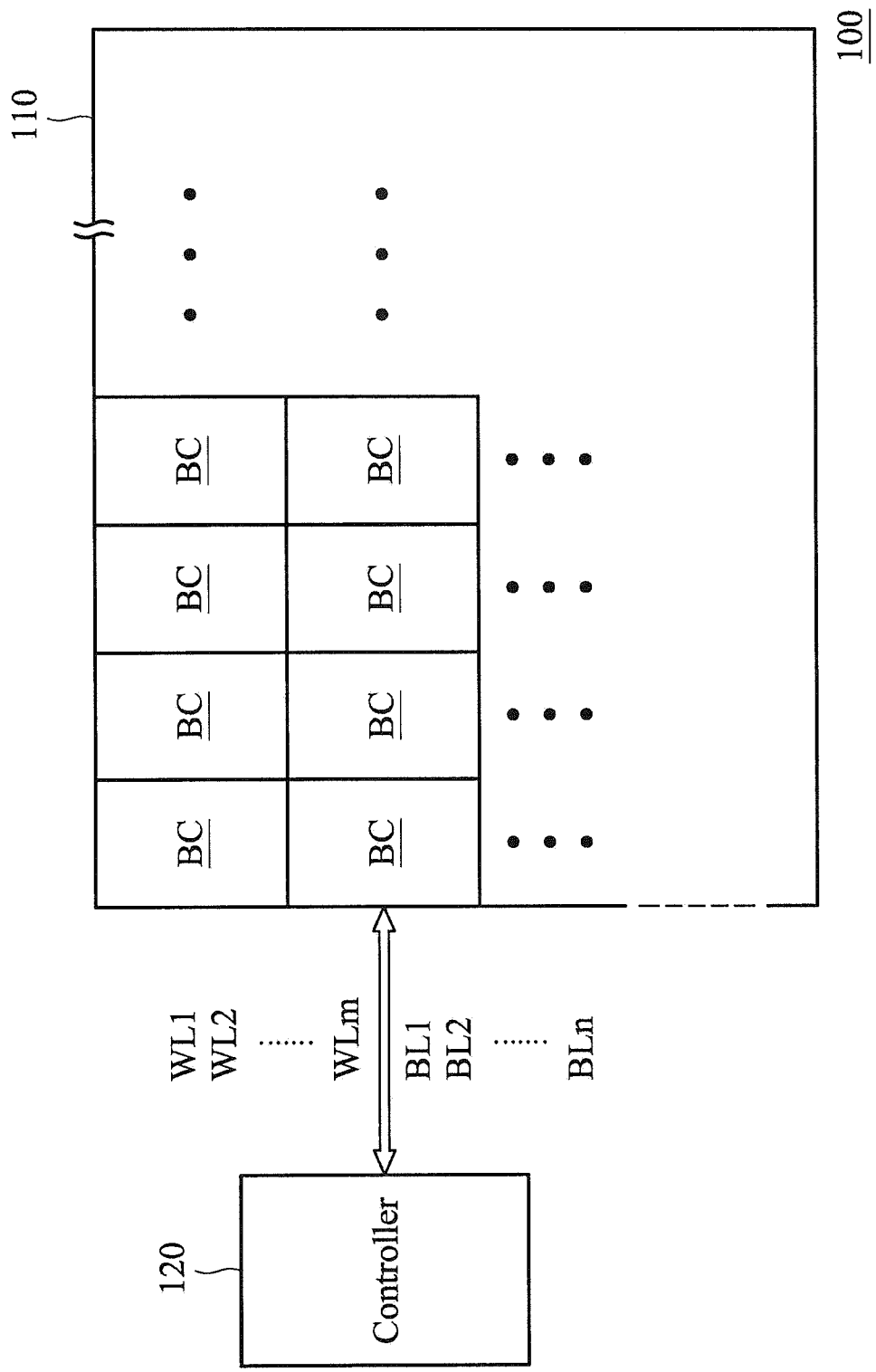
FIG. 1 shows a simplified diagram of a static random access memory (SRAM).

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and/or after a disclosed method, and some of the operations described can be replaced or eliminated for other embodiments of the method.

FIG. 1 shows a simplified diagram of a static random access memory (SRAM) 100. The SRAM 100 can be an independent device or be implemented in an integrated circuit (e.g. System on Chip (SOC)). The SRAM 100 includes a cell array 110 and a controller 120, wherein the cell array 110 includes a plurality of bit cells BC disposed in a plurality of rows and a plurality of columns.

In the SRAM 110, the controller 120 can access the bit cells of the cell array 110 by using a plurality of word lines WL1-WLm and a plurality of bit lines BL1-BLn. In the cell array 110, each bit cell is capable of storing one-bit data according to the corresponding word line and the corresponding bit line.

Figure 2A:
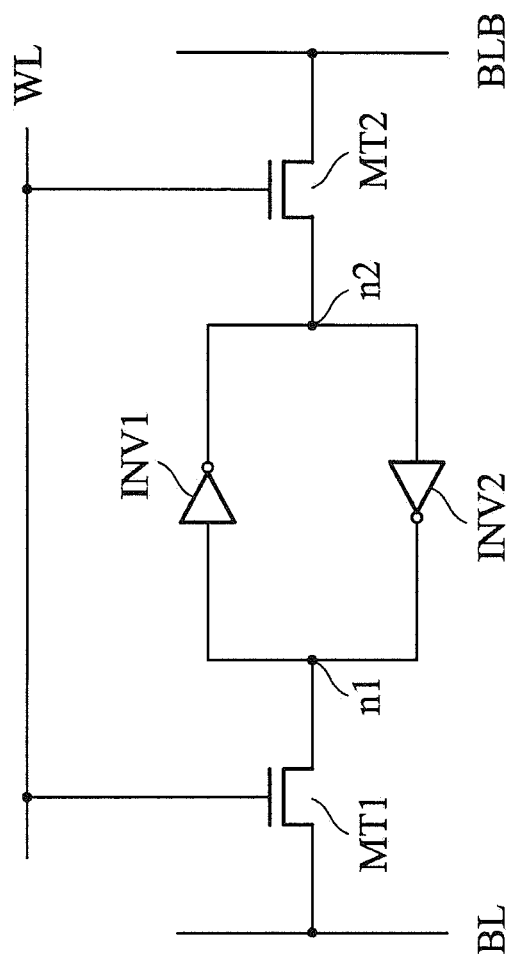
FIG. 2A shows a single-port SRAM bit cell, in accordance with some embodiments of the disclosure.

FIG. 2A shows a single-port SRAM bit cell 200, in accordance with some embodiments of the disclosure. The bit cell 200 includes a pair of cross-coupled inverters INV1 and INV2, and two pass gate transistors MT1 and MT2. The inverters INV1 and INV2 are cross coupled between the nodes n1 and n2, and form a latch. The pass gate transistor MT1 is coupled between a bit line BL and the node n1, and the pass gate transistor MT2 is coupled between a complementary bit line BLB and the node n2, wherein the complementary bit line BLB is complementary to the bit line BL. The gates of the pass gate transistors MT1 and MT2 are coupled to the same word line WL. Furthermore, the pass gate transistors MT1 and MT2 are NMOS transistors.

Figure 2B:
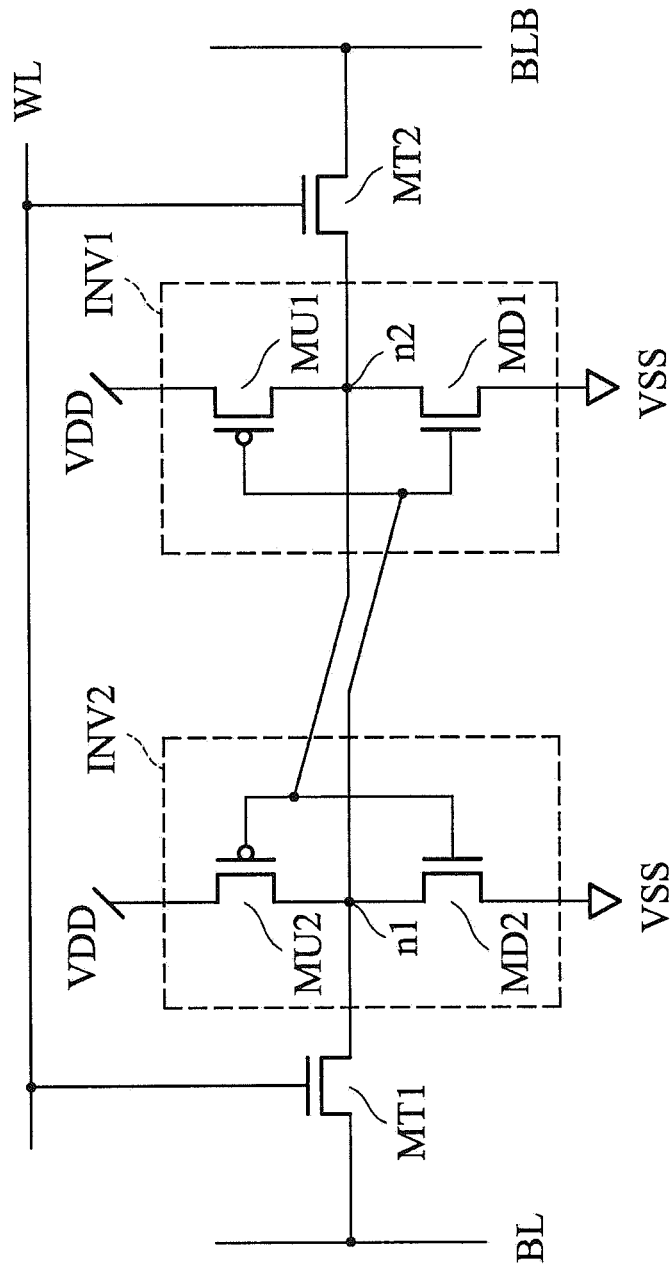
FIG. 2B shows a simplified diagram of the bit cell of FIG. 2A, in accordance with some embodiments of the disclosure.

FIG. 2B shows a simplified diagram of the bit cell 200 of FIG. 2A, in accordance with some embodiments of the disclosure. The inverter INV1 includes a pull-up transistor MU1 and a pull-down transistor MD1. The pull-up transistor MU1 is a PMOS transistor, and the pull-down transistor MD1 is an NMOS transistor. The drain of the pull-up transistor MU1 and the drain of the pull-down transistor MD1 are coupled to the node n2 connecting the pass gate transistor MT2. The gates of the pull-up transistor MU1 and the pull-down transistor MD1 are coupled to the node n1 connecting the pass gate transistor MT1. Furthermore, the source of the pull-up transistor MU1 is coupled to a power line VDD, and the source of the pull-down transistor MD1 is coupled to a ground line VSS.

Similarly, the inverter INV2 includes a pull-up transistor MU2 and a pull-down transistor MD2. The pull-up transistor MU2 is a PMOS transistor, and the pull-down transistor MD2 is an NMOS transistor. The drains of the pull-up transistor MU2 and the pull-down transistor MD2 are coupled to the node n1 connecting the pass gate transistor MT1. The gates of the pull-up transistor MU2 and the pull-down transistor MD2 are coupled to the node n2 connecting the pass gate transistor MT2. Furthermore, the source of the pull-up transistor MU2 is coupled to a power line VDD, and the source of the pull-down transistor MD2 is coupled to a ground line VSS.

Figure 3A:
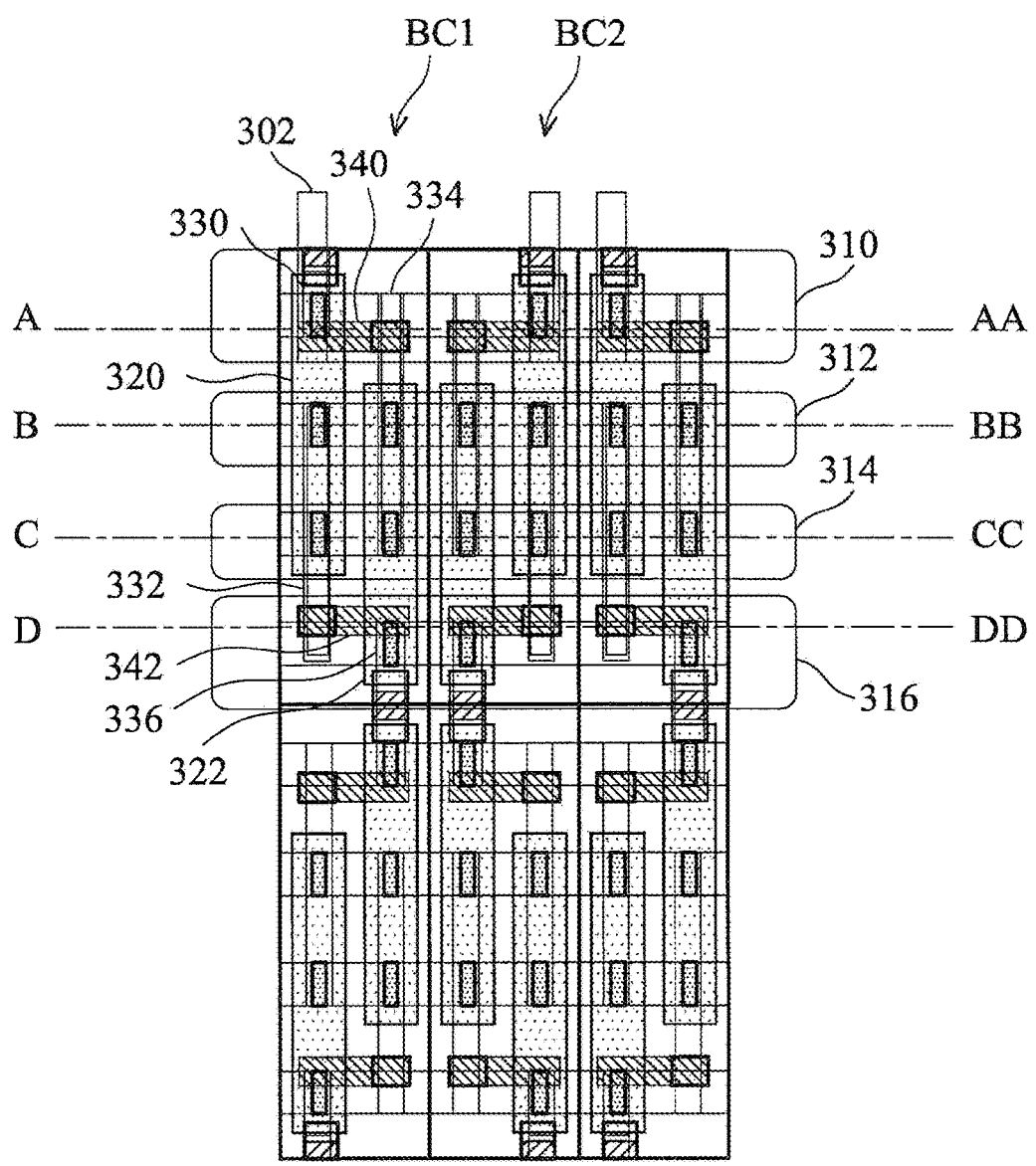
FIG. 3A shows a top view illustrating layout of two neighboring bit cells of a bit array.

FIG. 3A shows a top view illustrating layout of two neighboring bit cells BC1 and BC2 of a bit array. As mentioned above, each of the bit cells BC1 and BC2 include an inverter INV1 formed by a pull-up transistor MU1 and a pull-down transistor MD1, an inverter INV2 formed by a pull-up transistor MU2 and a pull-down transistor MD2, and two pass gate transistors MT1 and MT2. The details of the layout of the bit cells BC1 and BC2 will be described below.

FIG. 3B shows a simplified diagram illustrating configurations of six transistors in the two neighboring bit cells BC1 and BC2 of FIG. 3A. As shown in FIGS. 3A and 3B, the bit cell BC1 is adjacent to the bit cell BC2, and the layouts of the bit cells BC1 and BC2 are symmetrical. The pass gate transistors MT1 of the bit cells BC1 and BC2 are coupled to the same bit line BL, and the pass gate transistors MT2 of the bit cells BC1 and BC2 are coupled to the same complementary bit line BLB. Furthermore, the gates of the pass gate transistors MT1 and MT2 of the bit cell BC1 and the gates of the pass gate transistors MT1 and MT2 of the bit cell BC2 are coupled to the different word lines. For example, the gates of the pass gate transistors MT1 and MT2 of the bit cell BC1 are coupled to a first word line WL1, and the gates of the pass gate transistors MT1 and MT2 of the bit cell BC2 are coupled to a second word line WL2.

In the bit cell BC1, the pass gate transistor MT2, the pull-up transistor MU1, and the pull-down transistor MD1 are disposed in a first column Col1, and the pull-up transistor MU2, the pull-down transistor MD2, and the pass gate transistor MT1 are disposed in a second column Col2.

In the bit cell BC2, the pull-up transistor MU2, the pull-down transistor MD2, and the pass gate transistor MT1 are disposed in a third column Col3, and the pass gate transistor MT2, the pull-up transistor MU1, and the pull-down transistor MD1 are disposed in a fourth column Col4.

For the bit cells BC1 and BC2, the pass gate transistors MT2 are disposed in a first row Row1. Furthermore, the pull-up transistors MU1 and MU2 of the bit cells BC1 and BC2 are disposed in a second row Row2. The pull-down transistors MD1 and MD2 of the bit cells BC1 and BC2 are disposed in a third row Row3. The pass gate transistors MT1 are disposed in a fourth row Row4.

A layout structure of the bit array of FIG. 3A will be described below.

Figure 4A:
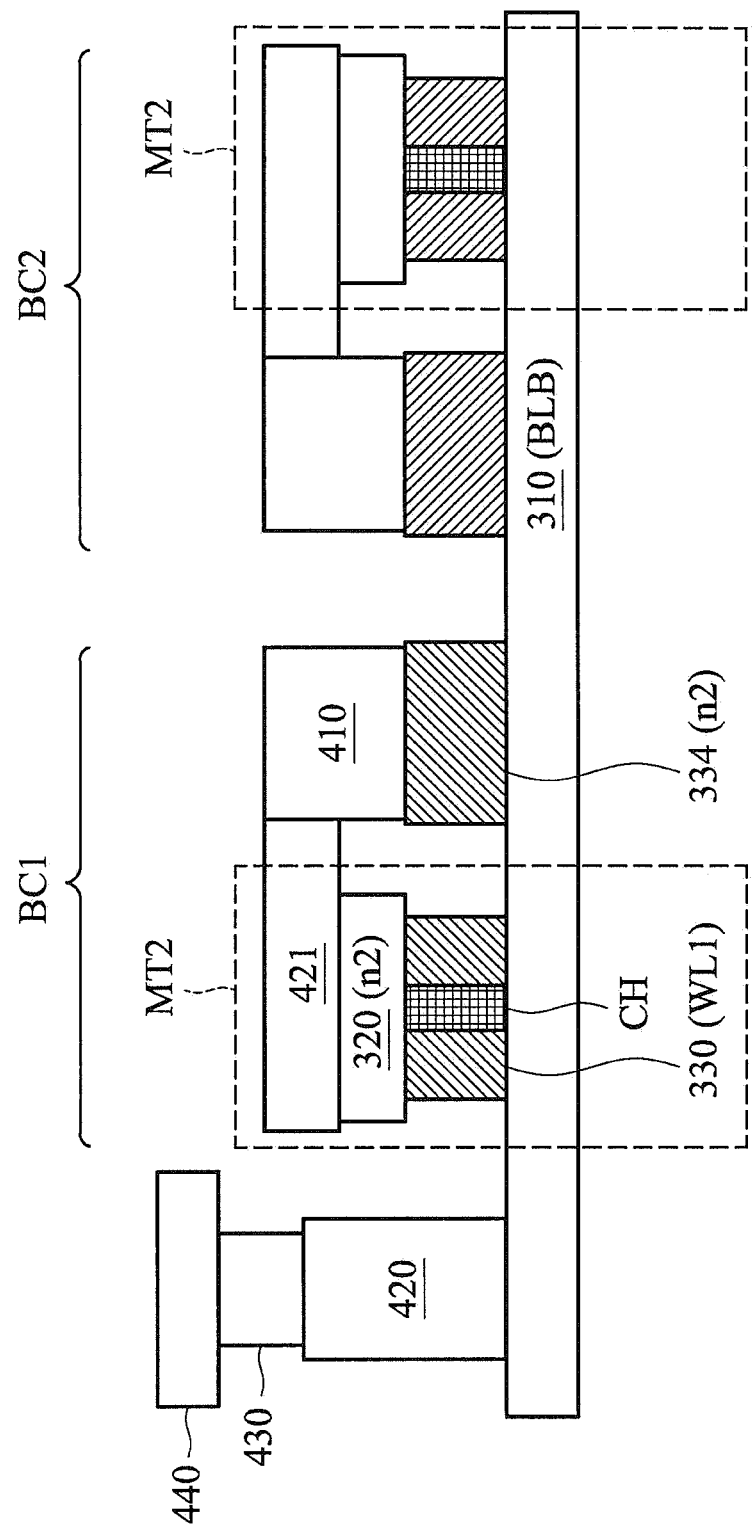
FIG. 4A shows a sectional diagram along a section line A-AA of the bit cells of FIG. 3A.

FIG. 4A shows a sectional diagram along a section line A-AA of the bit cells BC1 and BC2 of FIG. 3A. Referring to FIG. 3A and FIG. 4A together, the pass gate transistor MT2 of the bit cell BC1 and the pass gate transistor MT2 of the bit cell BC2 are formed. Due to the symmetrical layout of the bit cells BC1 and BC2, only the pass gate transistor MT2 of the bit cell BC1 is illustrated in order to simplify the description.

The sources of the pass gate transistors MT2 of the bit cells BC1 and BC2 are disposed on a source pad 310. The source pad 310 may be a drain silicide. The complementary bit line BLB is coupled to the source pad 310 via a conductive line 440, a via 430 and a metal layer on top of drain (i.e. metal on drain, MD) contact 420. The MD contact is disposed to form a contact to a doped region, such as a source region or a drain region. The conductive line 440 is disposed in a metal layer.

The drain of the pass gate transistors MT2 of the bit cell BC1 is disposed in a drain pad 320. As mentioned above, in each bit cell, the drain of the pass gate transistor MT2 is coupled to the gates of the pull-up transistor MU2 and the pull-down transistor MD2 at the node n2. Thus, the drain pad 320 is coupled to the gates of the pull-up transistor MU2 and the pull-down transistor MD2 via a MD contact 421, a metal layer on top of poly (i.e. metal on poly, MP) contact 410, and a gate region 334. The MP contact is disposed to form a contact to a gate region.

The gate of the pass gate transistors MT2 of the bit cell BC1 is disposed in a gate region 330, and a channel CH of the pass gate transistors MT2 is formed in the gate region 330 between the drain pad 320 and the source pad 310. Furthermore, the first word line WL1 is coupled to the gate region 330 via a conductive line 302. The conductive line 302 is disposed in a metal layer.

Figure 4B:
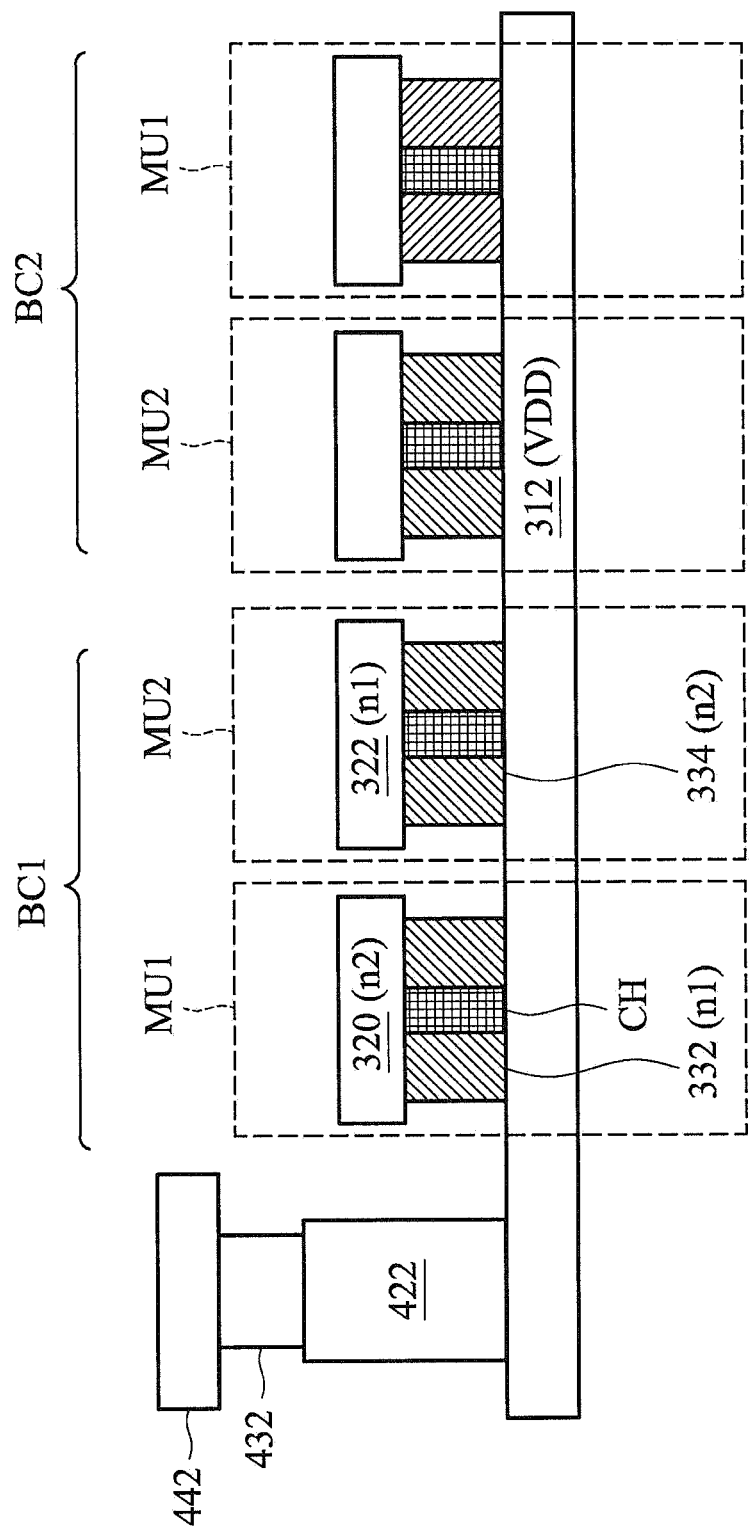
FIG. 4B shows a sectional diagram along a section line B-BB of the bit cells of FIG. 3A.

FIG. 4B shows a sectional diagram along a section line B-BB of the bit cells BC1 and BC2 of FIG. 3A. Referring to FIG. 3A and FIG. 4B together, the pull-up transistors MU1 and MU2 of the bit cell BC1 and the pull-up transistors MU1 and MU2 of the bit cell BC2 are formed. Due to the symmetrical layout of the bit cells BC1 and BC2, only the pull-up transistors MU1 and MU2 of the bit cell BC1 are illustrated in order to simplify the description.

The sources of the pull-up transistors MU1 and MU2 of the bit cells BC1 and BC2 are disposed on a source pad 312. The power line VDD is coupled to the source pad 312 via a conductive line 442, a via 432 and a MD contact 422.

For the bit cell BC1, the drain of the pull-up transistor MU1 is disposed in the drain pad 320. As mentioned above, in each bit cell, the drain of the pull-up transistor MU1 is coupled to the drains of the pull-down transistor MD1 and the pass gate transistor MT2 at the node n2. Thus, the drain of the pull-up transistor MU1 and the drain of the pass gate transistor MT2 are coupled together via the drain pad 320. Furthermore, the drain of the pull-up transistor MU2 is disposed in a drain pad 322.

For the bit cell BC1, the gate of the pull-up transistor MU1 is disposed in a gate region 332, and a channel CH of the of pull-up transistor MU1 is formed in the gate region 332 between the drain pad 320 and the source pad 312. Moreover, the gate of the pull-up transistor MU2 is disposed in the gate region 334, and a channel CH of the pull-up transistor MU2 is formed in the gate region 334 between the drain pad 322 and the source pad 312.

As mentioned above, the drain (e.g. the drain pad 320 of FIG. 4A) of the pass gate transistor MT2 is coupled to the gate (e.g. the gate region 334 of FIGS. 4A and 4B) of the pull-up transistor MU2 via the corresponding MD contact (e.g. the MD contact 421 of FIG. 4A) and the corresponding MP contact (e.g. the MP contact 410 of FIG. 4A).

Figure 4C:
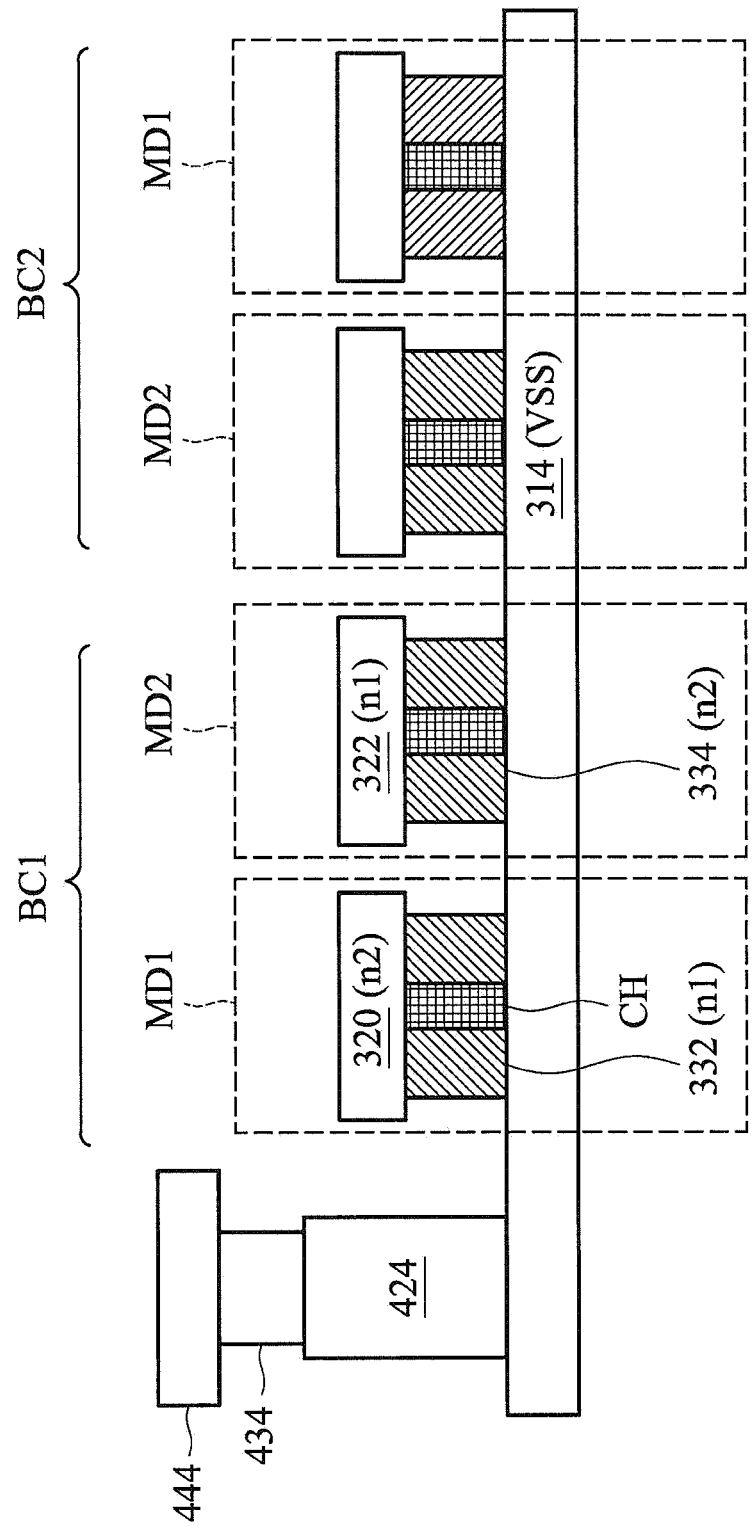
FIG. 4C shows a sectional diagram along a section line C-CC of the bit cells of FIG. 3A.

FIG. 4C shows a sectional diagram along a section line C-CC of the bit cells BC1 and BC2 of FIG. 3A. Referring to FIG. 3A and FIG. 4C together, the pull-down transistors MD1 and MD2 of the bit cell BC1 and the pull-down transistors MD1 and MD2 of the bit cell BC2 are formed. Due to the symmetrical layout of the bit cells BC1 and BC2, only the pull-down transistors MD1 and MD2 of the bit cell BC1 are illustrated in order to simplify the description.

The sources of the pull-down transistors MD1 and MD2 of the bit cells BC1 and BC2 are disposed on a source pad 314. The ground line VSS is coupled to the source pad 314 via a conductive line 444, a via 434 and a MD contact 424.

For the bit cell BC1, the drain of the pull-down transistor MD1 is disposed in the drain pad 320. The drains of the pull-down transistor MD1, the pull-up transistor MU1, and the pass gate transistor MT2 are coupled together via the drain pad 320. Furthermore, the drain of the pull-down transistor MD2 is disposed in the drain pad 322. The drains of the pull-down transistor MD2 and the pull-up transistor MU2 are coupled together via the drain pad 322.

For the bit cell BC1, the gate of the pull-down transistor MD1 is disposed in the gate region 332, and a channel CH of the pull-down transistor MD1 is formed in the gate region 332 between the drain pad 320 and the source pad 314. The gates of the pull-down transistor MD1 and the pull-up transistor MU1 are coupled together via the gate region 332. Moreover, the gate of the pull-down transistor MD2 is disposed in the gate region 334, and a channel CH of the pull-down transistor MD2 is formed in the gate region 334 between the drain pad 322 and the source pad 314. The gates of the pull-down transistor MD2 and the pull-up transistor MU2 are coupled together via the gate region 334.

Figure 4D:
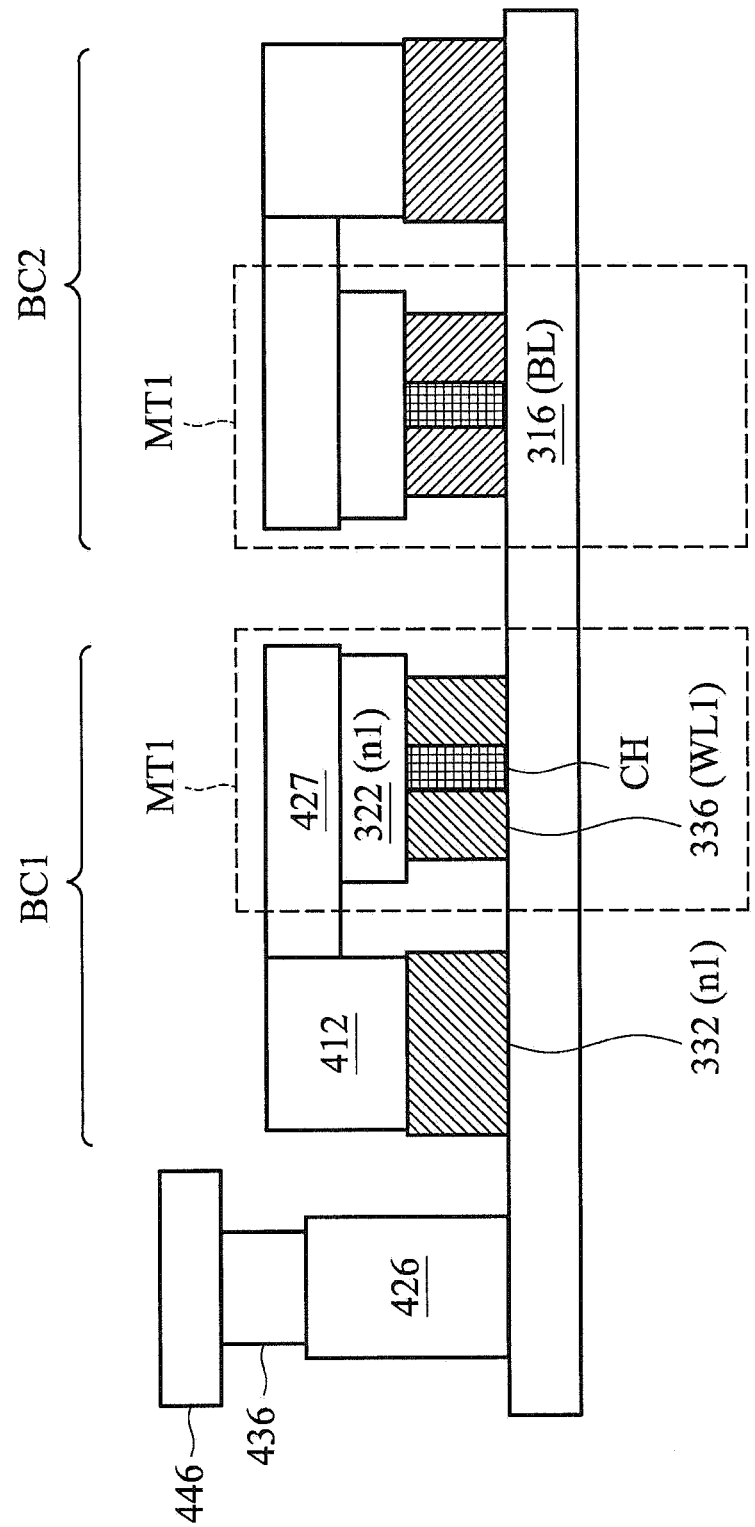
FIG. 4D shows a sectional diagram along a section line D-DD of the bit cells of FIG. 3A.

FIG. 4D shows a sectional diagram along a section line D-DD of the bit cells BC1 and BC2 of FIG. 3A. Referring to FIG. 3A and FIG. 4D together, the pass gate transistors MT1 of the bit cell BC1 and the bit cell BC2 are formed. Due to the symmetrical layout of the bit cells BC1 and BC2, only the pass gate transistor MT1 of the bit cell BC1 is illustrated in order to simplify the description.

The sources of the pass gate transistors MT1 of the bit cells BC1 and BC2 are disposed on a source pad 316. The bit line BL is coupled to the source pad 316 via a conductive line 446, a via 436 and a MD contact 426.

The drain of the pass gate transistors MT1 of the bit cell BC1 is disposed in the drain pad 322. The drain pad 322 is coupled to the gates of the pull-up transistor MU1 and the pull-down transistor MD1 via a MD contact 427, a MP contact 412, and the gate region 332. Furthermore, for the bit cell BC1, the drains of the pass gate transistors MT1, the pull-down transistor MD2, and the pull-up transistor MU2 are coupled together via the drain pad 322.

The gate of the pass gate transistor MT1 of the bit cell BC1 is disposed in a gate region 336, and a channel CH of the pass gate transistor MT1 is disposed in a gate region 336 between the drain pad 322 and the source pad 316. Furthermore, the first word line WL1 is coupled to the gate region 336.

Figure 5:
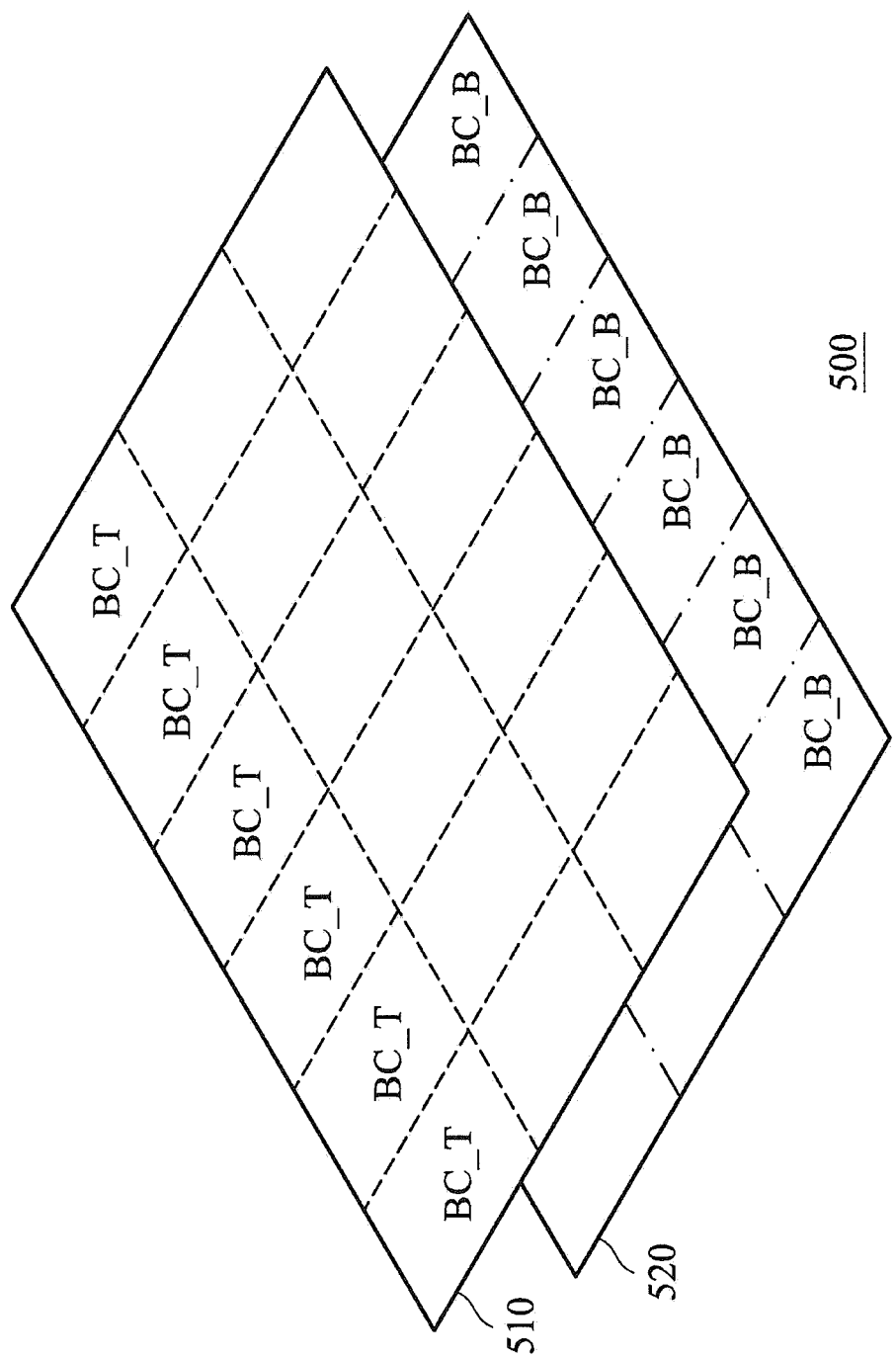
FIG. 5 shows a SRAM, in accordance with some embodiments of the disclosure.

FIG. 5 shows a SRAM 500, in accordance with some embodiments of the disclosure. The SRAM 500 includes a plurality of bit cells. As mentioned above, each bit cell includes six transistors comprising two pull-up transistors MU1 and MU2, two pull-down transistors MD1 and MD2, and two pass gate transistors MT1 and MT2, as shown in FIG. 2B. Furthermore, the pull-up transistor MU1 and the pull-down transistor MD1 form an inverter INV1, and the pull-up transistor MU2 and the pull-down transistor MD2 form an inverter INV2.

In this embodiment, the bit cells of the SRAM 500 are divided into a plurality of top tier cells BC_T and a plurality of bottom tier cells BC_B. The top tier cells BC_T are disposed in a plurality of rows and a plurality of columns of a first array 510. Furthermore, the bottom tier cells BC_B are disposed in a plurality of rows and a plurality of columns of a second array 520. It should be noted that the second array 520 is disposed under the first array 510 in a substrate.

In some embodiments, a quantity of the rows of the first array 510 is identical to a quantity of the rows of the second array 520. A quantity of the columns of the first array 510 is identical to a quantity of the columns of the second array 520.

Figure 6:
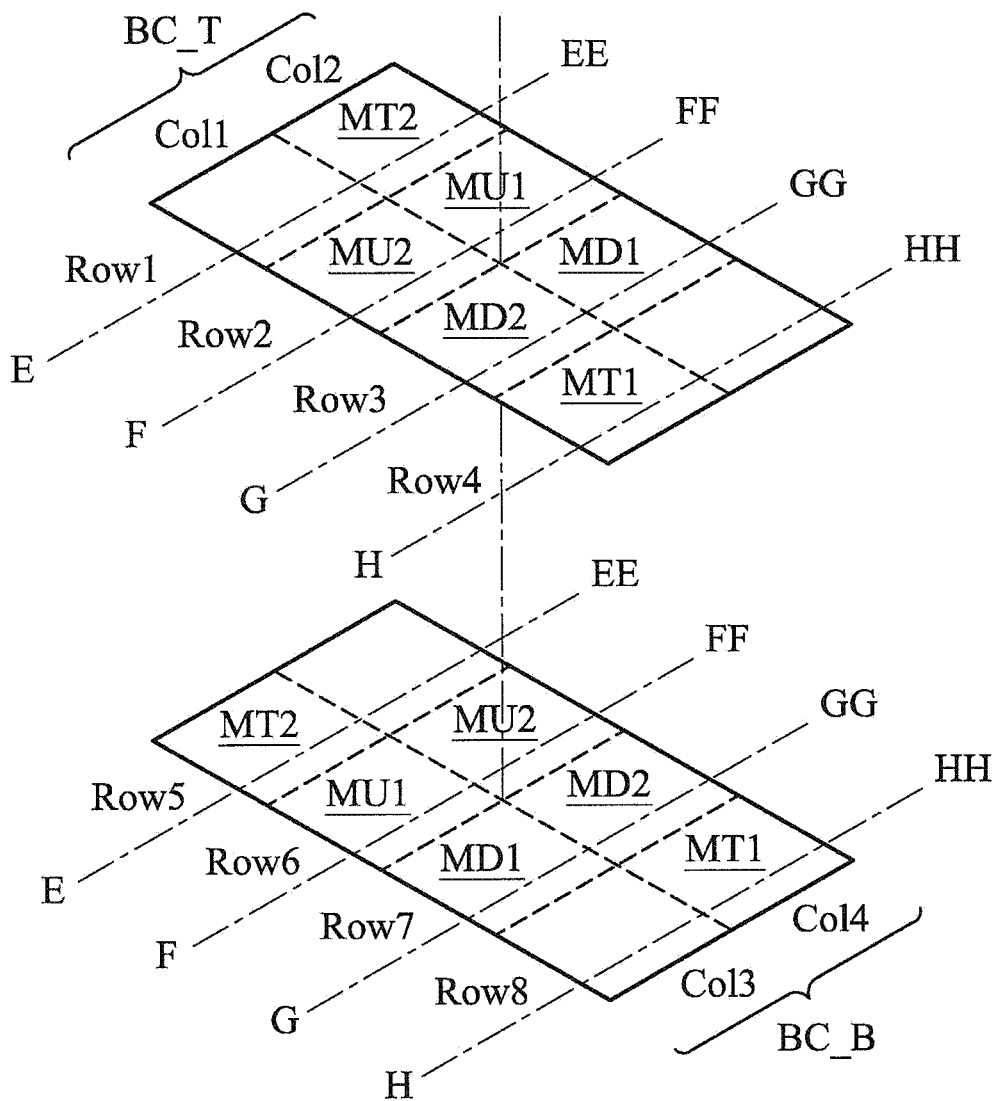
FIG. 6 shows a simplified diagram illustrating configurations of six transistors in a top tier cell and a bottom tier cell, in accordance with some embodiments of the disclosure.

FIG. 6 shows a simplified diagram illustrating configurations of six transistors in a top tier cell BC_T and a bottom tier cell BC_B, in accordance with some embodiments of the disclosure. The top tier cell BC_T is disposed on the bottom tier cell BC_B.

In the top tier cell BC_T, the pull-up transistor MU2, the pull-down transistor MD2, and the pass gate transistor MT1 are disposed in a first column Col1. Furthermore, the pass gate transistor MT2, the pull-up transistor MU1, and the pull-down transistor MD1 are disposed in a second column Col2.

In the bottom tier cell BC_B, the pass gate transistor MT2, the pull-up transistor MU1, and the pull-down transistor MD1 are disposed in a third column Col3. Moreover, the pull-up transistor MU2, the pull-down transistor MD2, and the pass gate transistor MT1 are disposed in a fourth column Col4.

In some embodiments, the first column Col1 is parallel and adjacent to the second column Col2. Furthermore, the third column Col3 is parallel and adjacent to the fourth column Col4. It should be noted that the third column Col3 is parallel to and under the first column Col1, and the fourth column Col4 is parallel to and under the second column Col2.

In the top tier cell BC_T, the pass gate transistor MT2 is disposed in a first row Row1. The pull-up transistors MU1 and MU2 are disposed in a second row Row2, and the second row Row2 is parallel and adjacent to the first row Row1. The pull-down transistors MD1 and MD2 are disposed in a third row Row3, and the third row Row3 is parallel and adjacent to the second row Row2. The pass gate transistor MT1 is disposed in a fourth row Row4, and the fourth row Row4 is parallel and adjacent to the third row Row3.

In the bottom tier cell BC_B, the pass gate transistor MT2 is disposed in a fifth row Row5, and the fifth row Row5 is parallel to and under the first row Row1. The pull-up transistors MU1 and MU2 are disposed in a sixth row Row6, and the sixth row Row6 is parallel to and under the second row Row2. The pull-down transistors MD1 and MD2 are disposed in a seventh row Row7, and the seventh row Row7 is parallel to and under the third row Row3. The pass gate transistor MT1 is disposed in an eighth row Row8, and the eighth row Row8 is parallel to and under the fourth row Row4.

In some embodiments, an inverter formed by the pull-up transistor MU2 and the pull-down transistor MD2 of the top tier cell BC_T is disposed on an inverter formed by the pull-up transistor MU1 and the pull-down transistor MD1 of the bottom tier cell BC_B. Furthermore, an inverter formed by the pull-up transistor MU1 and the pull-down transistor MD1 of the top tier cell BC_T is disposed on an inverter formed by the pull-up transistor MU2 and the pull-down transistor MD2 of the bottom tier cell BC_B.

A stacked structure of the top tier cell BC_T and the bottom tier cell BC_B of FIG. 6 will be described below.

Figure 7A:
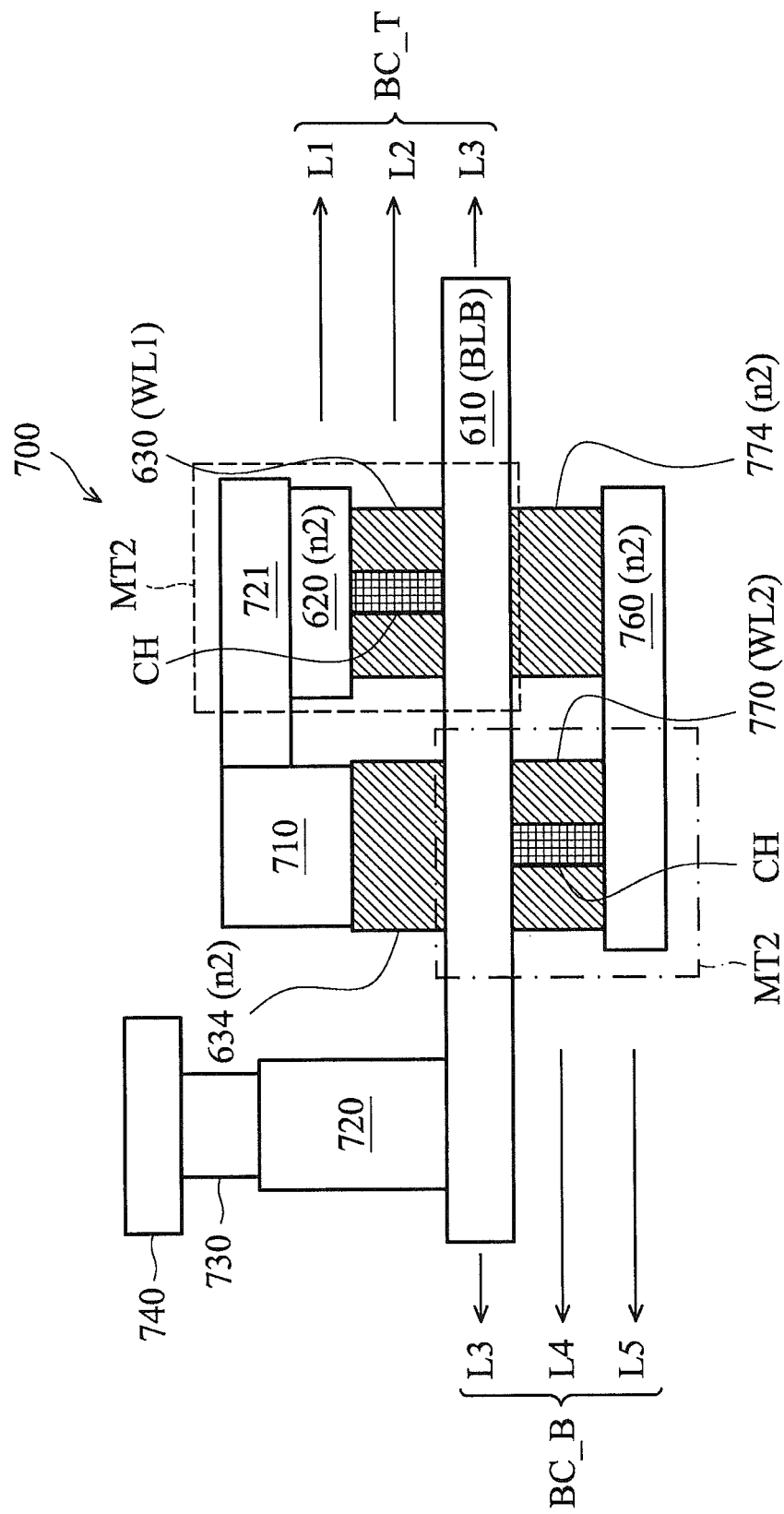
FIG. 7A shows a sectional diagram along a section line E-EE of the top tier cell and the bottom tier cell of FIG. 6, in accordance with some embodiments of the disclosure.

FIG. 7A shows a sectional diagram along a section line E-EE of the top tier cell BC_T and the bottom tier cell BC_B of FIG. 6, in accordance with some embodiments of the disclosure. The pass gate transistor MT2 of the top cell BC_T and the pass gate transistor MT2 of the bottom tier cell. BC_B are formed in a substrate 700.

The sources of the pass gate transistors MT2 of the top tier cell BC_T and the bottom tier BC_B are disposed on a source pad 610. A complementary bit line BLB is coupled to the source pad 610 via a conductive line 740 and a via 730 on the substrate 700 and a MD contact 720 of the substrate 700. In some embodiments, the conductive line 740 is disposed in a metal layer on the substrate 700. The source pad 610 is disposed in a third layer L3 of the substrate 700. It should be noted that the source pad 610 of the third layer L3 can be shared by the top tier cell BC_T and the bottom tier cell BC_B as the complementary bit line BLB.

For the top tier cell BC_T, the drain of the pass gate transistors MT2 is disposed in a drain pad 620. In the top tier cell BC_T, the drain of the pass gate transistor MT2 is coupled to the gates of the pull-up transistor MU2 and the pull-down transistor MD2. Thus, the drain pad 620 is coupled to the gates of the pull-up transistor MU2 and the pull-down transistor MD2 via a MD contact 721, a MP contact 710, and a gate region 334 of the substrate 700. It should be noted that the drain pad 620 is disposed in a first layer L1 of the substrate 700.

For the top tier cell BC_T, the gate of the pass gate transistors MT2 is disposed in a gate region 630, and a channel CH of the pass gate transistors MT2 is formed in the gate region 630 between the drain pad 620 and the source pad 610. Furthermore, a first word line WL1 is coupled to the gate region 630, and details of the connection will be described below. It should be noted that the gate regions 630 and 634 are disposed in a second layer L2 of the substrate 700, and the second layer L2 is arranged between the first layer L1 and the third layer L3 in the substrate 700.

For the bottom tier cell BC_B, the drain of the pass gate transistors MT2 is disposed in a drain pad 760. In the bottom tier cell BC_B, the drain of the pass gate transistor MT2 is coupled to the gates of the pull-up transistor MU2 and the pull-down transistor MD2. Thus, the drain pad 760 is capable of providing an internal connection for directly connecting to the gates of the pull-up transistor MU2 and the pull-down transistor MD2 via a gate region 774 of the substrate 700 without through a MD contact or a MP contact. Therefore, mask counts fabricating the SRAM can be decreased. It should be noted that the drain pad 760 is disposed in a fifth layer L5 of the substrate 700.

For the bottom tier cell BC_B, the gate of the pass gate transistors MT2 is disposed in a gate region 770, and a channel CH of the pass gate transistors MT2 is formed in the gate region 770 between the drain pad 760 and the source pad 610. Furthermore, a second word line WL2 is coupled to the gate region 770. It should be noted that the gate regions 770 and 774 are disposed in a fourth layer L4 of the substrate 700, and the fourth layer L4 is arranged between the third layer L3 and the fifth layer L5. In some embodiments, an extra mask is removed, such as CH bu, and no channel CH is formed in the gate region 774 between the drain pad 760 and the source pad 610.

Compared with the layout structure of the bit cells BC1 and BC2 of FIG. 4A, the layout area of the stacked structure of the top tier cell BC_T and the bottom tier cell BC_B of FIG. 7A is decreased by arranging the bottom tier cell BC_B under the top tier cell BC_T.

Figure 7B:
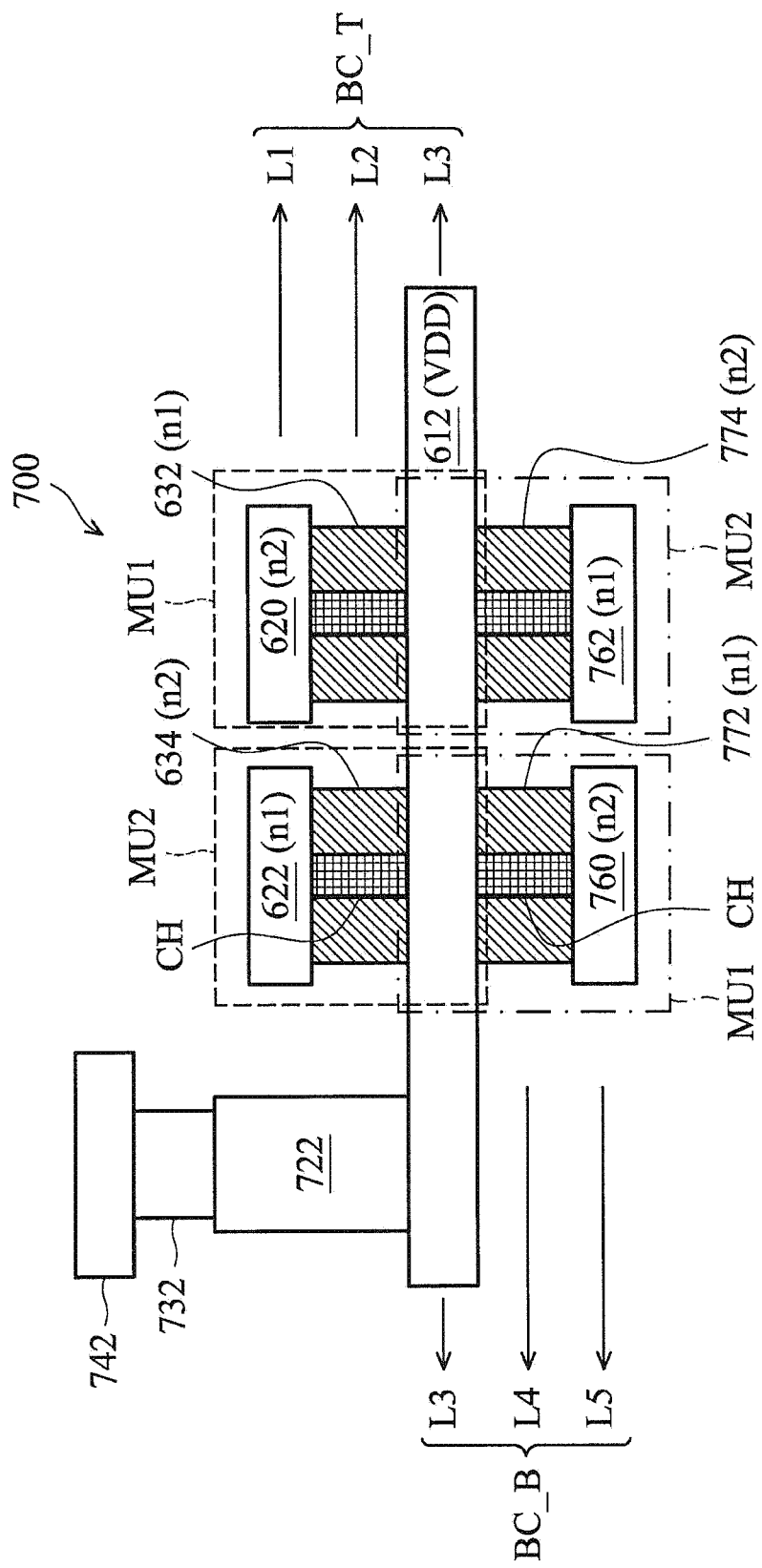
FIG. 7B shows a sectional diagram along a section line F-FF of the top tier cell and the bottom tier cell of FIG. 6, in accordance with some embodiments of the disclosure.

FIG. 7B shows a sectional diagram along a section line F-FF of the top tier cell BC_T and the bottom tier cell BC_B of FIG. 6, in accordance with some embodiments of the disclosure. The pull-up transistors MU2 and MU1 of the top tier cell BC_T and the pull-up transistors MU2 and MU1 of the bottom tier cell BC_B are formed in the substrate 700.

The sources of the pull-up transistors MU1 and MU2 of the top tier cell BC_T and the bottom tier cell BC_B are disposed on a source pad 612. The power line VDD is coupled to the source pad 612 via a conductive line 742 and a via 732 on the substrate 700, and a MD contact 722 of the substrate 700. In some embodiments, the conductive line 742 is disposed in a metal layer on the substrate 700. It should be noted that the source pad 612 of the third layer L3 can be shared by the top tier cell BC_T and the bottom tier cell BC_B as the power line VDD.

For the top tier cell BC_T, the drain of the pull-up transistor MU1 is disposed in the drain pad 620. Thus, the drain of the pull-up transistor MU1 and the drain of the pass gate transistor MT2 are coupled together via the drain pad 620. Furthermore, the drain of the pull-up transistor MU2 is disposed in a drain pad 622. The drain pads 620 and 622 are disposed in the same layer of the substrate 700, i.e. the first layer L1.

For the top tier cell BC_T, the gate of the pull-up transistor MU1 is disposed in a gate region 632, and a channel CH of the of pull-up transistor MU1 is formed in the gate region 632 between the drain pad 620 and the source pad 612. Moreover, the gate of the pull-up transistor MU2 is disposed in the gate region 634, and a channel CH of the pull-up transistor MU2 is formed in the gate region 634 between the drain pad 622 and the source pad 612. The gate of the pull-up transistor MU2 is coupled to the drain of the pass gate transistor MT2 via the gate region 634, the MP contact 710, the MD contact 721, and the drain pad 620 of FIG. 7A. The gate regions 632 and 634 are disposed in the same layer of the substrate 700, i.e. the second layer L2.

For the bottom tier cell BC_B, the drain of the pull-up transistor MU1 is disposed in the drain pad 760. Thus, the drain of the pull-up transistor MU1 and the drain of the pass gate transistor MT2 are coupled together via the drain pad 760. Furthermore, the drain of the pull-up transistor MU2 is disposed in a drain pad 762. The drain pads 760 and 762 are disposed in the same layer of the substrate 700, i.e. the fifth layer L5.

For the bottom tier cell BC_B, the gate of the pull-up transistor MU1 is disposed in a gate region 772, and a channel CH of the of pull-up transistor MU1 is formed in the gate region 772 between the drain pad 760 and the source pad 612. Moreover, the gate of the pull-up transistor MU2 is disposed in the gate region 774, and a channel CH of the pull-up transistor MU2 is formed in the gate region 774 between the drain pad 762 and the source pad 612. The gate of the pull-up transistor MU2 is coupled to the drain of the pass gate transistor MT2 via the gate region 774 and the drain pad 760 of FIG. 7A. The gate regions 774 and 772 are disposed in the same layer of the substrate 700, i.e. the second layer L4.

Compared with the layout structure of the bit cells BC1 and BC2 of FIG. 4B, the layout area of the stacked structure of the top tier cell BC_T and the bottom tier cell BC_B of FIG. 7B is decreased by arranging the bottom tier cell BC_B under the top tier cell BC_T.

Figure 7C:
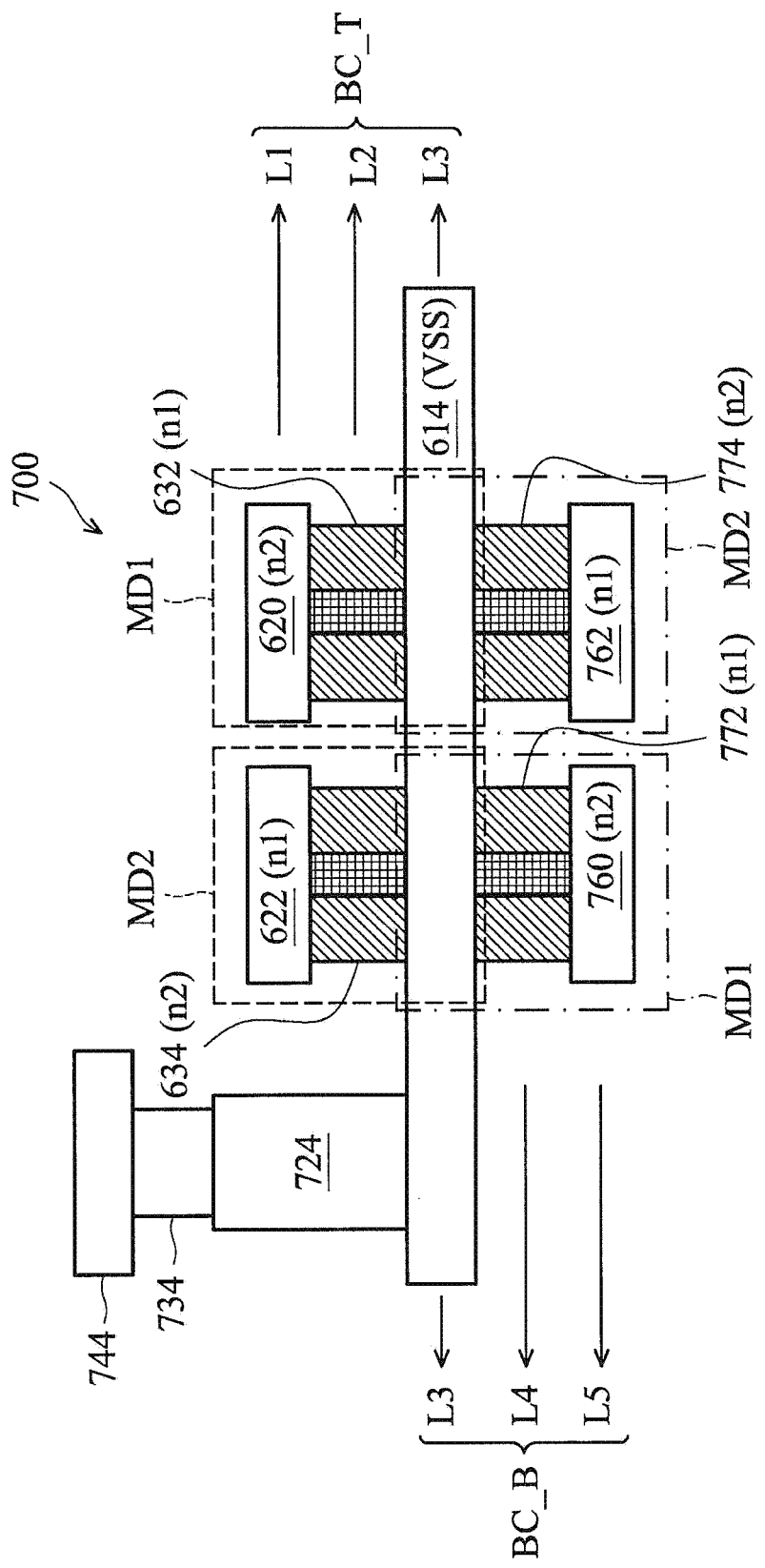
FIG. 7C shows a sectional diagram along a section line G-GG of the top tier cell and the bottom tier cell of FIG. 6, in accordance with some embodiments of the disclosure.

FIG. 7C shows a sectional diagram along a section line G-G of the top tier cell BC_T and the bottom tier cell BC_B of FIG. 6, in accordance with some embodiments of the disclosure. The pull-down transistors MD2 and MD1 of the top cell BC_T and the pull-down transistors MD2 and MD1 of the bottom tier cell BC_B are formed in the substrate 700.

The sources of the pull-down transistors MD1 and MD2 of the top tier cell BC_T and the bottom tier cell BC_B are disposed on a source pad 614. The ground line VSS is coupled to the source pad 614 via a conductive line 744 and a via 734 on the substrate 700, and a MD contact 724 of the substrate 700. In some embodiments, the conductive line 744 is disposed in a metal layer on the substrate 700. It should be noted that the source pad 614 of the third layer L3 can be shared by the top tier cell BC_T and the bottom tier cell BC_B as the ground line VSS.

For the top tier cell BC_T, the drain of the pull-down transistor MD1 is disposed in the drain pad 620. Thus, the drains of the pull-down transistor MD1, the pull-up transistor MU1 and the pass gate transistor MT2 are coupled together via the drain pad 620. Furthermore, the drain of the pull-down transistor MD2 is disposed in the drain pad 622. The drain of the pull-down transistor MD2 is coupled to the drain of the pull-up transistor MU2 via the drain pad 622.

For the top tier cell BC_T, the gate of the pull-down transistor MD1 is disposed in the gate region 632, and a channel CH of the of pull-down transistor MD1 is formed in the gate region 632 between the drain pad 620 and the source pad 614. Moreover, the gate of the pull-down transistor MD2 is disposed in the gate region 634, and a channel CH of the pull-down transistor MD2 is formed in the gate region 634 between the drain pad 622 and the source pad 614.

For the bottom tier cell BC_B, the drain of the pull-down transistor MD1 is disposed in the drain pad 760. Thus, the drains of the pull-down transistor MD1, the pull-up transistor MU1 and the pass gate transistor MT2 are coupled together via the drain pad 760. Furthermore, the drain of the pull-down transistor MD2 is disposed in the drain pad 762. The drain of the pull-down transistor MD2 is coupled to the drain of the pull-up transistor MU1 via the drain pad 762.

For the bottom tier cell BC_B, the gate of the pull-down transistor MD1 is disposed in the gate region 772, and a channel CH of the of pull-up transistor MU1 is formed in the gate region 772 between the drain pad 760 and the source pad 614. Moreover, the gate of the pull-down transistor MD2 is disposed in the gate region 774, and a channel CH of the pull-up transistor MU2 is formed in the gate region 774 between the drain pad 762 and the source pad 614.

Compared with the layout structure of the bit cells BC1 and BC2 of FIG. 4C, the layout area of the stacked structure of the top tier cell BC_T and the bottom tier cell BC_B of FIG. 7C is decreased by arranging the bottom tier cell BC_B under the top tier cell BC_T.

Figure 7D:
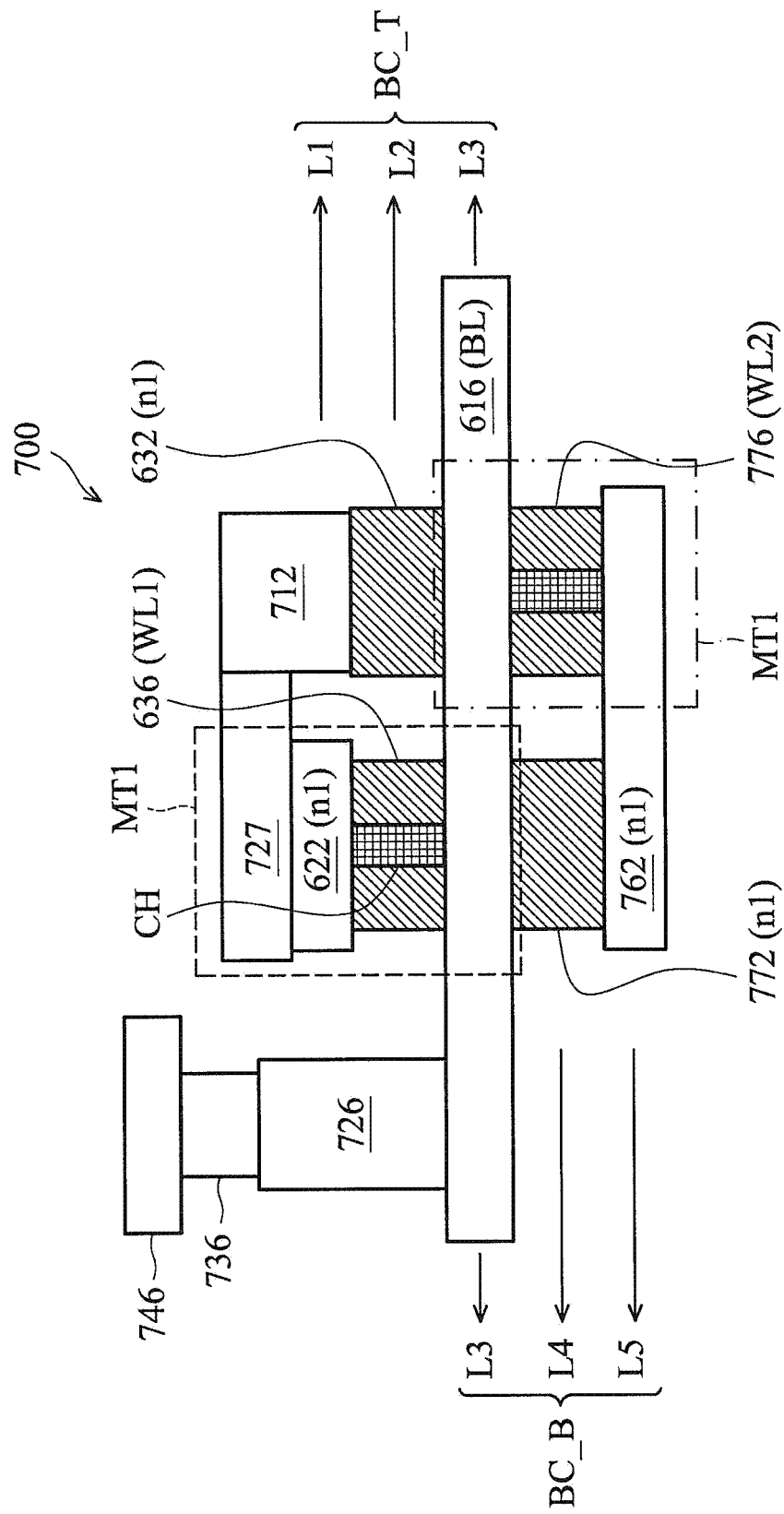
FIG. 7D shows a sectional diagram along a section line H-HH of the top tier cell and the bottom tier cell of FIG. 6, in accordance with some embodiments of the disclosure.

FIG. 7D shows a sectional diagram along a section line H-HH of the top tier cell BC_T and the bottom tier cell BC_B of FIG. 6, in accordance with some embodiments of the disclosure. The pass gate transistor MT1 of the top cell BC_T and the pass gate transistor MT1 of the bottom tier cell BC_B are formed in the substrate 700.

The sources of the pass gate transistors MT1 of the top cell BC_T and the bottom tier BC_B are disposed on a source pad 616. A bit line BL is coupled to the source pad 616 via a conductive line 746 and a via 736 on the substrate 700 and a MD contact 726 of the substrate 700. In some embodiments, the conductive line 746 is disposed in a metal layer on the substrate 700. The source pad 616 is disposed in the third layer L3 of the substrate 700. It should be noted that the source pad 616 of the third layer L3 can be shared by the top tier cell BC_T and the bottom tier cell BC_B as the bit line BL.

For the top tier cell BC_T, the drain of the pass gate transistors MT1 is disposed in the drain pad 622. In the top tier cell BC_T, the drain of the pass gate transistor MT1 is coupled to the drains of the pull-up transistor MU2 and the pull-down transistor MD2 via the drain pad 622. Furthermore, the drain of the pass gate transistor MT1 is coupled to the gates of the pull-up transistor MU1 and the pull-down transistor MD1. Thus, the drain pad 632 is coupled to the gates of the pull-up transistor MU1 and the pull-down transistor MD1 via a MD contact 727, a MP contact 712, and the gate region 632 of the substrate 700.

For the top tier cell BC_T, the gate of the pass gate transistors MT1 is disposed in a gate region 636, and a channel CH of the pass gate transistors MT1 is formed in the gate region 636 between the drain pad 622 and the source pad 616. Furthermore, the first word line WL1 is coupled to the gate region 636. It should be noted that the gate regions 630 and 634 are disposed in the same layer of the substrate 700, i.e. the second layer L2.

For the bottom tier cell BC_B, the drain of the pass gate transistors MT1 is disposed in the drain pad 762. In the bottom tier cell BC_B, the drain of the pass gate transistor MT1 is coupled to the gates of the pull-up transistor MU1 and the pull-down transistor MD1. Thus, the drain pad 762 is capable of providing an internal connection for directly connecting to the gates of the pull-up transistor MU1 and the pull-down transistor MD1 via the gate region 772 of the substrate 700 without through a MD contact or a MP contact. Therefore, mask counts fabricating the SRAM can be decreased.

For the bottom tier cell BC_B, the gate of the pass gate transistors MT1 is disposed in a gate region 776, and a channel CH of the pass gate transistors MT1 is formed in the gate region 776 between the drain pad 762 and the source pad 616. Furthermore, the second word line WL2 is coupled to the gate region 776. The gate regions 776 and 772 are disposed in the same layer of the substrate 700, i.e. the layer L4. In some embodiments, the n type well is removed by mask, such as CH bu, and no channel CH is formed in the gate region 772 between the drain pad 762 and the source pad 616.

Compared with the layout structure of the bit cells BC1 and BC2 of FIG. 4D, the layout area of the stacked structure of the top tier cell BC_T and the bottom tier cell BC_B of FIG. 7D is decreased by arranging the bottom tier cell BC_B under the top tier cell BC_T.

Figure 8A:
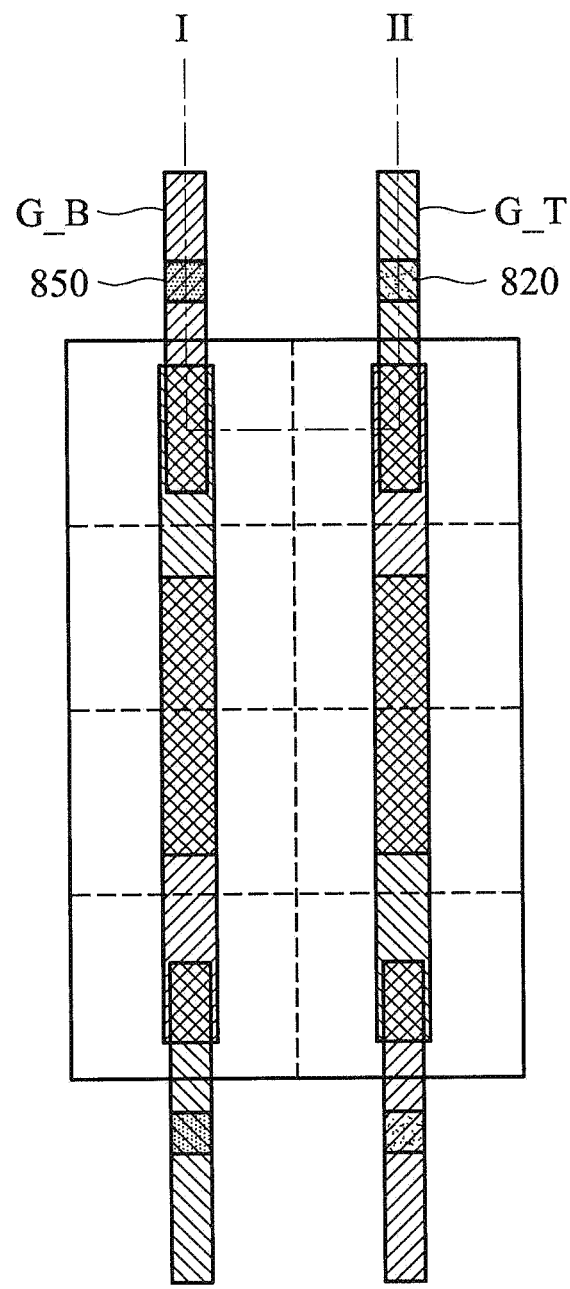
FIG. 8A shows a top view illustrating configurations of gate regions of a top tier cell and a bottom tier cell, in accordance with some embodiments of the disclosure.

FIG. 8A shows a top view illustrating configurations of gate regions of a top tier cell BC_T and a bottom tier cell BC_B, in accordance with some embodiments of the disclosure. The top tier cell BC_T is disposed on the bottom tier cell BC_B. In this embodiment, label G_T represents the gate regions of the top tier cell BC_T. Furthermore, label G_B represents the gate regions of the bottom tier cell BC_B. A via 820 is disposed on the gate regions G_T of the top tier cell BC_T. In some embodiments, the via 820 is used to connect a first word line WL1 to the top tier cell BC_T. Moreover, a via 850 is disposed on the gate regions G_B of the bottom tier cell BC_B. In some embodiments, the via 850 is used to connect a second word line WL2 to the bottom tier cell BC_B.

Figure 8B:
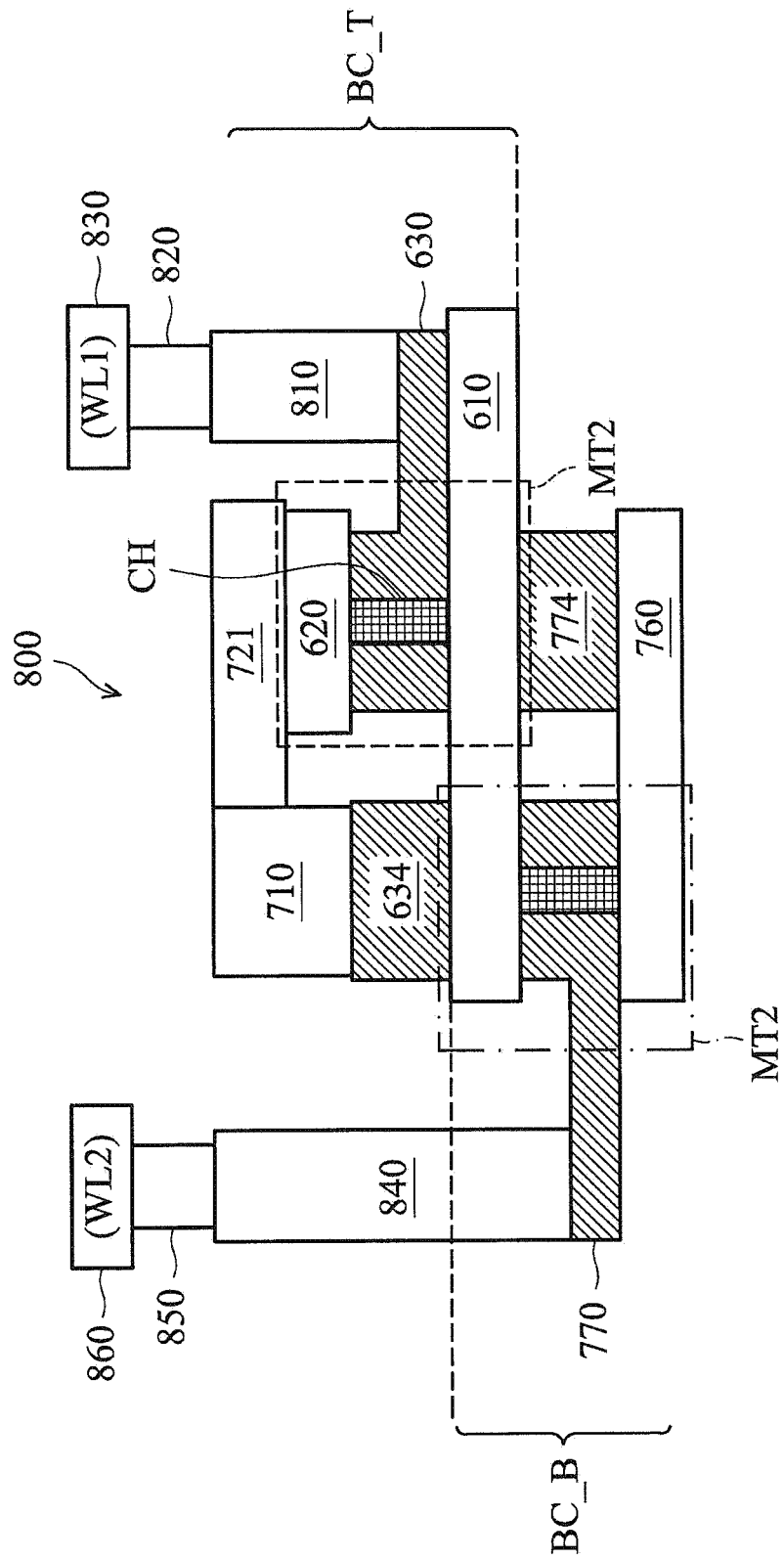
FIG. 8B shows a sectional diagram along a section line I-II of the top tier cell and the bottom tier cell, in accordance with some embodiments of the disclosure.

FIG. 8B shows a sectional diagram along a section line I-II of the top tier cell BC_T and the bottom tier cell BC_B, in accordance with some embodiments of the disclosure. As mentioned above, the pass gate transistor MT2 of the top cell BC_T and the pass gate transistor MT2 of the bottom tier cell BC_B are formed in a substrate 800. The stacked structure of the pass gate transistors MT2 of the top tier cell BC_T and the bottom tier cell BC_B can reference to FIG. 7A.

For the top tier cell BC_T, the gate region 630 is coupled to the first word line WL1 via a MP contact 810 of the substrate 800, and the via 820 and a conductive line 830 on the substrate 800. In some embodiments, the conductive line 830 is disposed in a metal layer on the substrate 800.

For the bottom tier cell BC_B, the gate region 770 is coupled to the second word line WL2 via a MP contact 840 of the substrate 800, and the via 850 and a conductive line 860 on the substrate 800. In some embodiments, the conductive line 860 is disposed in a metal layer on the substrate 800.

By arranging the pass gate transistor MT2 of the top tier cell BC_T and the pass gate transistor MT2 of the bottom tier cell BC_B at different columns, the connection path between the gate of pass gate transistor MT2 of the top tier cell BC_T and the first word line WL1 will not overlap the connection path between the gate of pass gate transistor MT2 of the bottom tier cell BC_B and the second word line WL2. Thus, layout complexity is decreased.

According to the embodiments, the stacked layout can be implemented in other types of SRAM cells, such as a dual port SRAM cell, which includes four pass-gate transistors.

Embodiments for decreasing layout area of SRAM are provided. A plurality of bit cells of a SRAM are divided into a first bit array and a second bit array disposed under the first bit array. The first bit array includes a plurality of top tier cells disposed in a plurality of rows and a plurality of columns. The second bit array includes a plurality of bottom tier cells disposed in a plurality of rows and a plurality of columns. The top tier cell and the bottom tier cell corresponding to the same bit line and the same complementary bit line are stacked in five layers (e.g. L1-L5 of FIGS. 7A-7D) of a substrate. The third layer (e.g. L3 of FIGS. 7A-7D) is shared by the stacked cells as the power line for the sources of the pull-up transistors, the ground line for the sources of the pull-down transistors, the complementary bit line for the sources of the second pass gate transistors, and the bit line for the sources of the first pass gate transistors, respectively. By stacking the top tier cell and the bottom tier cell, layout area of the SRAM is decreased. In some embodiments, it can achieve almost half area reduction. For the bottom tier cell, the drains of the pass gate transistors can serve as the interconnection for connecting the gates that is disposed adjacent to the drains of the pass gate transistors without through a MP or MD contact.

In some embodiments, a static random access memory (SRAM) is provided. The SRAM includes a plurality of bit cells. Each of the bit cells includes a first inverter, a second inverter cross-coupled with the first inverter, a first pass gate transistor coupled between an input of the first inverter and a bit line, and a second pass gate transistor coupled between an input of the second inverter and a complementary bit line. The first inverter includes a first pull-up transistor and a first pull-down transistor. The second inverter includes a second pull-up transistor and a second pull-down transistor. The bit cells are divided into a plurality of top tier cells and a plurality of bottom tier cells, and each of the bottom tier cells is disposed under the individual top tier cell. The first inverter of the top tier cell is disposed on the second inverter of the corresponding bottom tier cell within a substrate, and the second inverter of the top tier cell is disposed on the first inverter of the corresponding bottom tier cell within the substrate.

In some embodiments, a SRAM is provided. The SRAM includes a plurality of bit cells. Each of the bit cells includes a first inverter, a second inverter cross-coupled with the first inverter, a first pass gate transistor coupled between an input of the first inverter and a bit line, and a second pass gate transistor coupled between an input of the second inverter and a complementary bit line. The first inverter includes a first pull-up transistor and a first pull-down transistor. The second inverter includes a second pull-up transistor and a second pull-down transistor. The bit cells are divided into a plurality of top tier cells formed a first array and a plurality of bottom tier cells formed a second array disposed under the first array. The first pass gate transistor, the second pull-up transistor, and the second pull-down transistor of the top tier cell are disposed in a first column of the first array, and the second pass gate transistor, the first pull-up transistor, and the first pull-down transistor of the corresponding bottom tier cell are disposed in a second column of the second array parallel to and under the first column. Sources of the transistors of the top tier cell and sources of the transistors of the corresponding bottom tier cell are disposed between the first and second columns.

In some embodiments, a SRAM is provided. The SRAM includes a top tier bit cell coupled to a first word line, a bit line, and a complementary bit line of a metal layer, and a bottom tier bit cell and disposed under the top bit cell and coupled to a second word line, the bit line, and the complementary bit line of the metal layer. The top tier bit cell includes six transistors in a substrate. In the top tier bit cell, drains of the transistors of the top tier cell are disposed on a first layer of the substrate, gates of the transistors of the top tier cell are disposed on a second layer under the first layer of the substrate, sources of the transistors of the top tier cell are disposed on a third layer under the second layer of the substrate. The bottom tier bit cell includes six transistors in the substrate. In the bottom tier bit cell, sources of the transistors of the bottom tier cell are disposed on the third layer, gate of the transistors of the bottom tier cell are disposed on a fourth layer under the third layer of the substrate, drains of the transistors of the bottom tier cell are disposed on a fifth layer under the fourth layer of the substrate. The six transistors of the top tier bit cell and the bottom tier bit cell respectively include: a first pull-up transistor and a first pull-down transistor, wherein a first inverter is formed by the first pull-up and pull-down transistors; a second pull-up transistor and a second pull-down transistor, wherein a second inverter cross-coupled with the first inverter is formed by the second pull-up and pull-down transistors; a first pass gate transistor coupled between an input of the first inverter and the bit line; and a second pass gate transistor coupled between an input of the second inverter and the complementary bit line. The first and second pass gate transistors of the top tier bit cell are controlled by the first word line, and the first and second pass gate transistors of the bottom tier bit cell are controlled by the second word line.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A static random access memory (SRAM), comprising:
a plurality of SRAM cells on a substrate, each SRAM cell comprising:
    a first inverter comprising a first pull-up transistor and a first pull-down transistor;
    a second inverter cross-coupled with the first inverter and comprising a second pull-up transistor and a second pull-down transistor;
    a first pass gate transistor coupled between an input of the first inverter and a bit line; and
    a second pass gate transistor coupled between an input of the second inverter and a complementary bit line, wherein each of the first and second pull-up transistors, the first and second pull-down transistors, and the first and second pass gate transistors has a vertical transistor structure comprising a gate having a channel formed in a direction perpendicular to the substrate, a source in contact with a top or bottom portion of the gate, and a drain in contact with a portion of the gate opposite to the source; and
    a pad comprising a top surface and a bottom surface opposite of the top surface, wherein the source or the drain of the first or the second pull-down transistor of a first SRAM cell is disposed on the top surface and the source or the drain of the first or the second pull-down transistor of a second SRAM cell is disposed on the bottom surface, wherein the first SRAM cell is disposed over the second SRAM cell.

2. The SRAM of claim 1, further comprising an other bit line electrically connected to the first pass gate transistors of the first and second SRAM cells.

3. The SRAM of claim 1, further comprising an other complementary bit line electrically connected to the second pass gate transistors of the first and second SRAM cells.

4. The SRAM of claim 1, further comprising a word line electrically connected to the first and the second pass gate transistors of the first or second SRAM cells.

5. The SRAM of claim 1, wherein the drain of the first pass gate transistor of each SRAM cell is electrically connected to the drains of the first pull-up and the first pull-down transistors and to gates of the second pull-up and second pull-down transistors.

6. The SRAM of claim 1, wherein the drain of the second pass gate transistor of each SRAM cell is electrically connected to the drains of the second pull-up and the second pull-down transistors and to gates of the first pull-up and first pull-down transistors.

7. The SRAM of claim 1, further comprising a ground line, wherein the pad is electrically connected to the ground line.

8. A static random access memory (SRAM), comprising:
a plurality of SRAM cells on a substrate, each SRAM cell comprising:
    a first inverter comprising a first pull-up transistor and a first pull-down transistor;
    a second inverter cross-coupled with the first inverter and comprising a second pull-up transistor and a second pull-down transistor;
    a first pass gate transistor coupled between an input of the first inverter and a bit line; and
    a second pass gate transistor coupled between an input of the second inverter and a complementary bit line, wherein each of the first and second pull-up transistors, the first and second pull-down transistors, and the first and second pass gate transistors has a vertical transistor structure comprising a gate having a channel formed in a direction perpendicular to the substrate, a source in contact with a top or bottom portion of the gate, and a drain in contact with a portion of the gate opposite to the source;
    a first pad comprising a first top surface and a first bottom surface opposite of the first top surface, wherein the source or the drain of the first or the second pull-up transistor of a first SRAM cell is disposed on the first top surface and the source or the drain of the first or the second pull-up transistor of a second SRAM cell is disposed on the first bottom surface, wherein the first SRAM cell is disposed over the second SRAM cell;
    a second pad comprising a second top surface and a second bottom surface opposite of the second top surface, wherein the source or the drain of the first or the second pass gate transistor of the first SRAM cell is disposed on the second top surface and the source or the drain of the first or the second pass gate transistor of the second SRAM cell is disposed on the second bottom surface; and
    a controller configured to access each of the SRAM cells via the bit line associated with the SRAM cells and a word line associated with the SRAM cells.

9. The SRAM of claim 8, further comprising a power line, wherein the first pad is electrically connected to the power line.

10. The SRAM of claim 8, further comprising an other bit line and an other complementary bit line, wherein the second pad is electrically connected to the other bit line or the other complementary bit line.

11. The SRAM of claim 8, wherein the source of the first pass gate transistor is electrically connected to the bit line and the source of the second pass gate transistor is electrically connected to the complementary bit line.

12. The SRAM of claim 8, wherein gates of the first and second pass gate transistors are electrically connected to the word line.

13. The SRAM of claim 8, wherein the drain of the first pass gate transistor is electrically connected to the drains of the first pull-up and the first pull-down transistors and to gates of the second pull-up and second pull-down transistors and the drain of the second pass gate transistor of is electrically connected to the drains of the second pull-up and the second pull-down transistors and to gates of the first pull-up and first pull-down transistors.

14. The SRAM of claim 8, further comprising a third pad comprising a third top surface and a third bottom surface opposite of the third top surface, wherein the source or the drain of the first or the second pull-down transistor of the first SRAM cell is disposed on the third top surface and the source or the drain of the first or the second pull-down transistor of the second SRAM cell is disposed on the third bottom surface.

15. A static random access memory (SRAM), comprising:
an array of SRAM cells on a substrate, wherein the array comprises:
    a top tier of SRAM cells comprising a first SRAM cell coupled to a first word line, a bit line, and a complementary bit line; and
    a bottom tier of SRAM cells disposed under the top tier of SRAM cells in a stacked arrangement and comprising a second SRAM cell disposed under the first SRAM cell coupled to a second word line, the bit line, and the complementary bit line, wherein each of the SRAM cells in the top and bottom tiers comprises:
  a first inverter comprising a first pull-up transistor and a first pull-down transistor;
  a second inverter cross-coupled with the first inverter and comprising a second pull-up transistor and a second pull-down transistor;
  a first pass gate transistor coupled between an input of the first inverter and the bit line; and
  a second pass gate transistor coupled between an input of the second inverter and the complementary bit line, wherein each of the first and second pull-up transistors, the first and second pull-down transistors, and the first and second pass gate transistors has a vertical transistor structure comprising a gate having a channel formed in a direction perpendicular to the substrate, a source in contact with a top or bottom portion of the gate, and a drain in contact with a portion of the gate opposite to the source and wherein the source or drain of a first vertical transistor associated with the first SRAM cell is shared with the source or drain of a second vertical transistor associated with the second SRAM cell;
a pad comprising a top surface and a bottom surface opposite of the top surface, wherein the source or the drain of the first or the second pull-down transistor of a first SRAM cell is disposed on the top surface and the source or the drain of the first or the second pull-down transistor of a second SRAM cell is disposed on the bottom surface, wherein the first SRAM cell is disposed over the second SRAM cell; and
a controller configured to access each of the SRAM cells in the array via the bit line, the complementary bit line, the first word line, the second word line, or a combination thereof.

16. The SRAM of claim 15, wherein the source of the first pass gate transistor is electrically connected to the bit line.

17. The SRAM of claim 15, wherein the source of the second pass gate transistor is electrically connected to the complementary bit line.

18. The SRAM of claim 15, wherein gates of the first and the second pass gate transistors of the first SRAM cell are electrically connected to the first word line, and wherein gates of the first and the second pass gate transistors of the second SRAM cell are electrically coupled to the second word line.

19. The SRAM of claim 15, wherein the drain of the first pass gate transistor of each SRAM cell is electrically connected to the drains of the first pull-up and the first pull-down transistors and to gates of the second pull-up and second pull-down transistors.

20. The SRAM of claim 15, wherein the drain of the second pass gate transistor of each SRAM cell is electrically connected to the drains of the second pull-up and the second pull-down transistors and to gates of the first pull-up and first pull-down transistors.

* * * * *